United States Patent
Lin et al.

(10) Patent No.: US 11,307,457 B1
(45) Date of Patent: Apr. 19, 2022

(54) DIRECT TYPE BACKLIGHT DEVICE

(71) Applicants: Interface Technology (ChengDu) Co., Ltd., Sichuan (CN); Interface Optoelectronics (ShenZhen) Co., Ltd., Guangdong (CN); Interface Optoelectronics (Wuxi) Co., Ltd., Jiangsu (CN); General Interface Solution Limited, Miaoli County (TW)

(72) Inventors: Jung-Sung Lin, Guangdong (CN); Jeng-Bin Hsu, Guangdong (CN); Ta-Jen Huang, Guangdong (CN)

(73) Assignees: Interface Technology (ChengDu) Co., Ltd., Sichuan (CN); Interface Optoelectronics (ShenZhen) Co.. Ltd., Guangdong (CN); Interface Optoelectronics (Wuxi) Co.. Ltd., Jiangsu (CN); General Interface Solution Limited, Miaoli County (TW)

( * ) Notice: Subject to any disclaimer, the term of this patent is extended or adjusted under 35 U.S.C. 154(b) by 0 days.

(21) Appl. No.: 17/158,018

(22) Filed: Jan. 26, 2021

(30) Foreign Application Priority Data

Dec. 14, 2020 (CN) .......................... 202011465708.6

(51) Int. Cl.
*G02F 1/00* (2006.01)
*G02F 1/13357* (2006.01)
*H05K 1/11* (2006.01)
*G02F 1/1335* (2006.01)

(52) U.S. Cl.
CPC .. *G02F 1/133605* (2013.01); *G02F 1/133603* (2013.01); *G02F 1/133612* (2021.01); *H05K 1/111* (2013.01); *H05K 2201/10106* (2013.01); *H05K 2201/10674* (2013.01)

(58) Field of Classification Search
CPC ..... H05K 1/111; G02F 1/133603; G02F 1/12; G02F 1/05
See application file for complete search history.

(56) References Cited

U.S. PATENT DOCUMENTS

| 2019/0310516 | A1* | 10/2019 | Kyoukane | G02F 1/133603 |
| 2020/0089057 | A1* | 3/2020 | Watanabe | G02B 6/0055 |
| 2020/0159073 | A1* | 5/2020 | Kyoukane | G02F 1/133605 |
| 2020/0300444 | A1* | 9/2020 | Lee | F21V 3/12 |

* cited by examiner

*Primary Examiner* — Gerald J Sufleta, II
(74) *Attorney, Agent, or Firm* — CKC & Partners Co., LLC

(57) ABSTRACT

A direct type backlight device includes a printed circuit board, a light reflector and plural Mini-LEDs. The light reflector and the Mini-LEDs are disposed over the printed circuit board. The light reflector is arranged between at least part of adjacent Mini-LEDs. Each of the Mini-LEDs includes a non-light-emitting layer and a light-emitting layer arranged on the non-light-emitting layer. A bottom surface of the light-emitting layer of each of the Mini-LEDs is higher than a top surface of the light reflector.

14 Claims, 11 Drawing Sheets

DIRECT TYPE BACKLIGHT DEVICE

RELATED APPLICATIONS

This application claims priority to China Application Serial Number 202011465708.6, filed Dec. 14, 2020, the disclosures of which are incorporated herein by reference in their entireties.

BACKGROUND

Field of Invention

The present invention relates to a backlight device. More particularly, the present invention relates to a direct type backlight device.

Description of Related Art

The direct type backlight device is directly arranged behind the liquid crystal display (LCD) panel, and has further advantage in design of a narrow border, and is widely applied in large-size LCD devices. However, the direct type backlight device also causes an increase of the thickness of the LCD device.

Mini LED is a small-size light emitting diode (LED) with a size of approximately 100 μm. Applying Mini LEDs into the direct type backlight device could realize the design of a narrow border while reducing the thickness of the LCD device.

In general, in order to increase the efficiency of the reflected light, a reflective material (e.g., the light reflector or the light reflective sheet) is usually attached on the direct type backlight device so as to improve the overall brightness. Further, in terms of optical characteristics, as the light reflector is thicker, the relative reflectivity is higher. In other words, the thickness of the light reflector has a great influence on the luminous efficiency.

Regarding the known direct type backlight device, the top surface of the light reflector is higher than the bottom surface of the Mini LEDs. However, according to the experiment results, the higher that the top surface of the light reflector relative to the bottom surface of the Mini LEDs is, the worse the luminous efficiency is, such that the increase of the thickness of the light reflector is considerably limited. Therefore, it is necessary to develop a solution to solve the above problems.

SUMMARY

The present invention provides a direct type backlight device. The direct type backlight device includes a printed circuit board (PCB), a light reflector and plural Mini-LEDs. The light reflector and the Mini-LEDs are disposed over the PCB. The light reflector is arranged between at least part of adjacent Mini-LEDs. Each of the Mini-LEDs includes a non-light-emitting layer and a light-emitting layer arranged on the non-light-emitting layer. A bottom surface of the light-emitting layer of each of the Mini-LEDs is higher than a top surface of the light reflector.

In accordance with one or more embodiments of the invention, the light reflector has a thickness (Tr). The thickness (Tr) of the light reflector has a tolerance (Ae). A distance from the bottom surface of the light-emitting layer of each of the Mini-LEDs to the top surface of the light reflector is represented as (Hd). Hd≥(Tr*Ae).

In accordance with one or more embodiments of the invention, the PCB has plural bump structures, and the Mini-LEDs are respectively disposed over the bump structures.

In accordance with one or more embodiments of the invention, the PCB further has plural bonding pads disposed over the bump structures, and the Mini-LEDs are disposed over the bonding pads.

In accordance with one or more embodiments of the invention, each of the bump structures has a thickness (Hb). Each of the bonding pads has a thickness (Cu). The non-light-emitting layer of each of the Mini-LEDs has a thickness (To). Hb=Tr−Cu−(To−Tr*Ae).

In accordance with one or more embodiments of the invention, at least two contact pads of one of the Mini-LEDs are disposed within a vertical projection of one of the bump structures, and the one of the bump structures corresponds to the one of the Mini-LEDs.

In accordance with one or more embodiments of the invention, the PCB further has a solder mask layer conformally formed on an upper surface of the PCB and a side surface of each of the bump structures.

In accordance with one or more embodiments of the invention, the light reflector is disposed over the solder mask layer, and the solder mask layer partially covers the light reflector.

In accordance with one or more embodiments of the invention, each of the bump structures has a thickness (Hb). Each of the bonding pads has a thickness (Cu). The non-light-emitting layer of each of the Mini-LEDs has a thickness (To). The solder mask layer has a thickness (T). Hb=Tr-Cu-(To-Tr*Ae)+T.

In accordance with one or more embodiments of the invention, each of the bonding pads includes a metal layer and a surface plating layer disposed on the metal layer.

In accordance with one or more embodiments of the invention, the PCB includes a solder mask printing layer, a substrate layer disposed over the solder mask printing layer, and a metal layer disposed over the substrate layer.

In accordance with one or more embodiments of the invention, each of the Mini-LEDs has two contact pads, and the contact pads are electrically connected to the bonding pads in a one-by-two manner.

In accordance with one or more embodiments of the invention, each of the Mini-LEDs has four contact pads, and the contact pads are electrically connected to the bonding pads in a one-by-one manner.

In accordance with one or more embodiments of the invention, the thicker the light reflector is, the higher a luminous efficiency of the direct type backlight device is.

The present invention provides a direct type backlight device. The direct type backlight device includes a printed circuit board (PCB), a light reflector, and plural Mini-LEDs. The PCB has plural bump structures. The light reflector is arranged between at least part of adjacent bump structures. The Mini-LEDs are respectively disposed over the bump structures. Each of the Mini-LEDs includes a non-light-emitting layer and a light-emitting layer arranged on the non-light-emitting layer. A bottom surface of the light-emitting layer of each of the Mini-LEDs is higher than a top surface of the light reflector.

In accordance with one or more embodiments of the invention, the light reflector has a thickness (Tr). The thickness (Tr) of the light reflector has a tolerance (Ae). A distance from the bottom surface of the light-emitting layer of each of the Mini-LEDs to the top surface of the light reflector is represented as (Hd). Hd≥(Tr*Ae).

In accordance with one or more embodiments of the invention, the PCB further has plural bonding pads disposed over the bump structures, and the Mini-LEDs are disposed over the bonding pads.

In accordance with one or more embodiments of the invention, each of the bump structures has a thickness (Hb). Each of the bonding pads has a thickness (Cu). The non-light-emitting layer of each of the Mini-LEDs has a thickness (To). $Hb=Tr-Cu-(To-Tr*Ae)$.

In accordance with one or more embodiments of the invention, at least two contact pads of one of the Mini-LEDs are disposed within a vertical projection of one of the bump structures, and the one of the bump structures corresponds to the one of the Mini-LEDs.

In accordance with one or more embodiments of the invention, the PCB further has a solder mask layer conformally formed on an upper surface of the PCB and a side surface of each of the bump structures. The light reflector is disposed over the solder mask layer, and the solder mask layer partially covers the light reflector.

In order to let above mention of the present invention and other objects, features, advantages, and embodiments of the present invention to be more easily understood, the description of the accompanying drawing as follows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
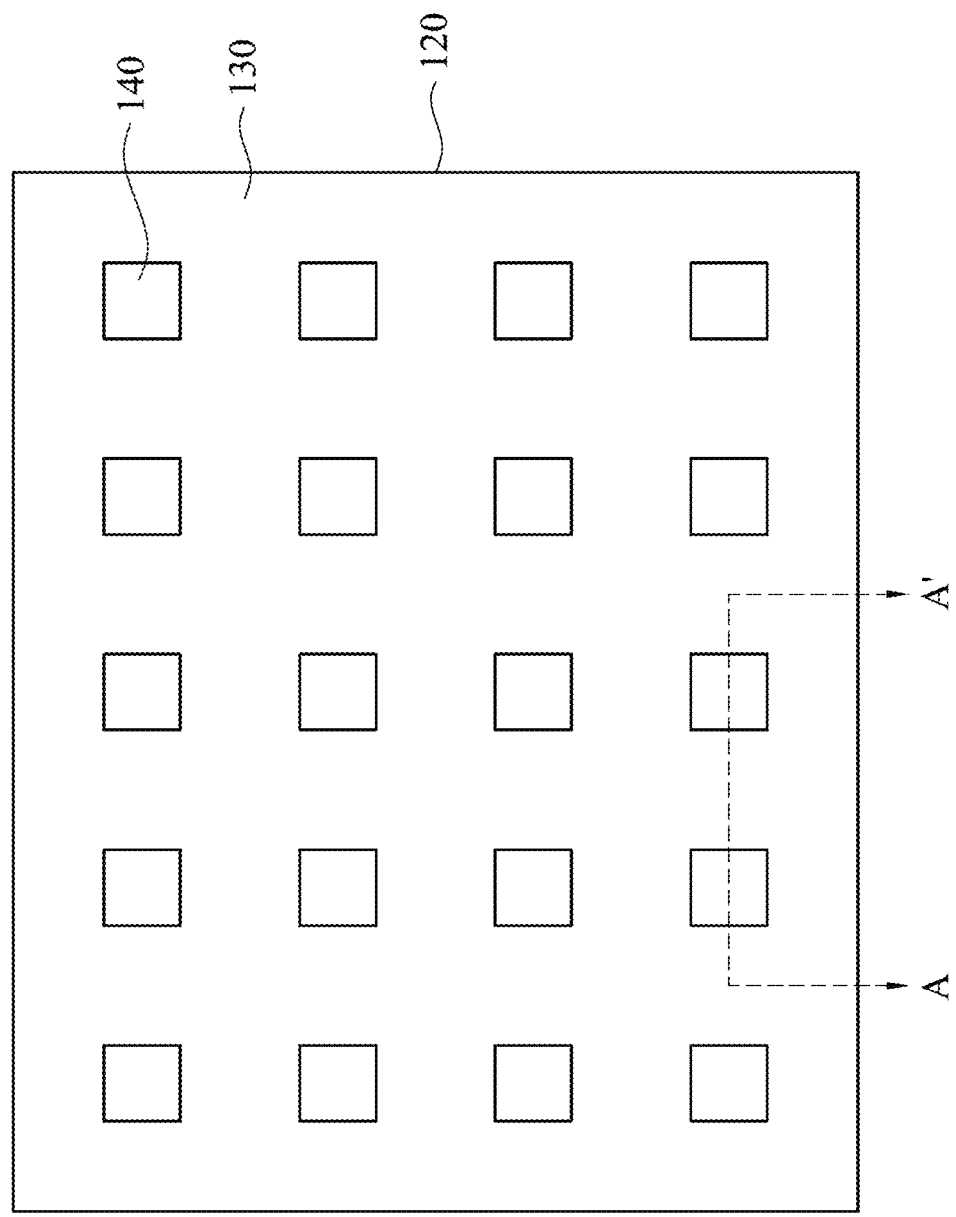
FIG. 1 illustrates a top view of a direct type backlight device according to a first embodiment of the present invention.

The detailed explanation of the invention is described as following. The described preferred embodiments are presented for purposes of illustrations and description, and they are not intended to limit the scope of the invention.

Furthermore, the spatial relationship between two elements described in the present disclosure applies not only to the orientation depicted in the drawings, but also to the orientations not represented by the drawings, such as the orientation of the inversion. Moreover, the terms "connected", "coupled", "electrically connected" or the like between two components referred to in the present disclosure are not limited to the direct connection, coupling, or electrical connection of the two components, and may also include indirect connection, coupling, or electrical connection as required.

Figure 2:
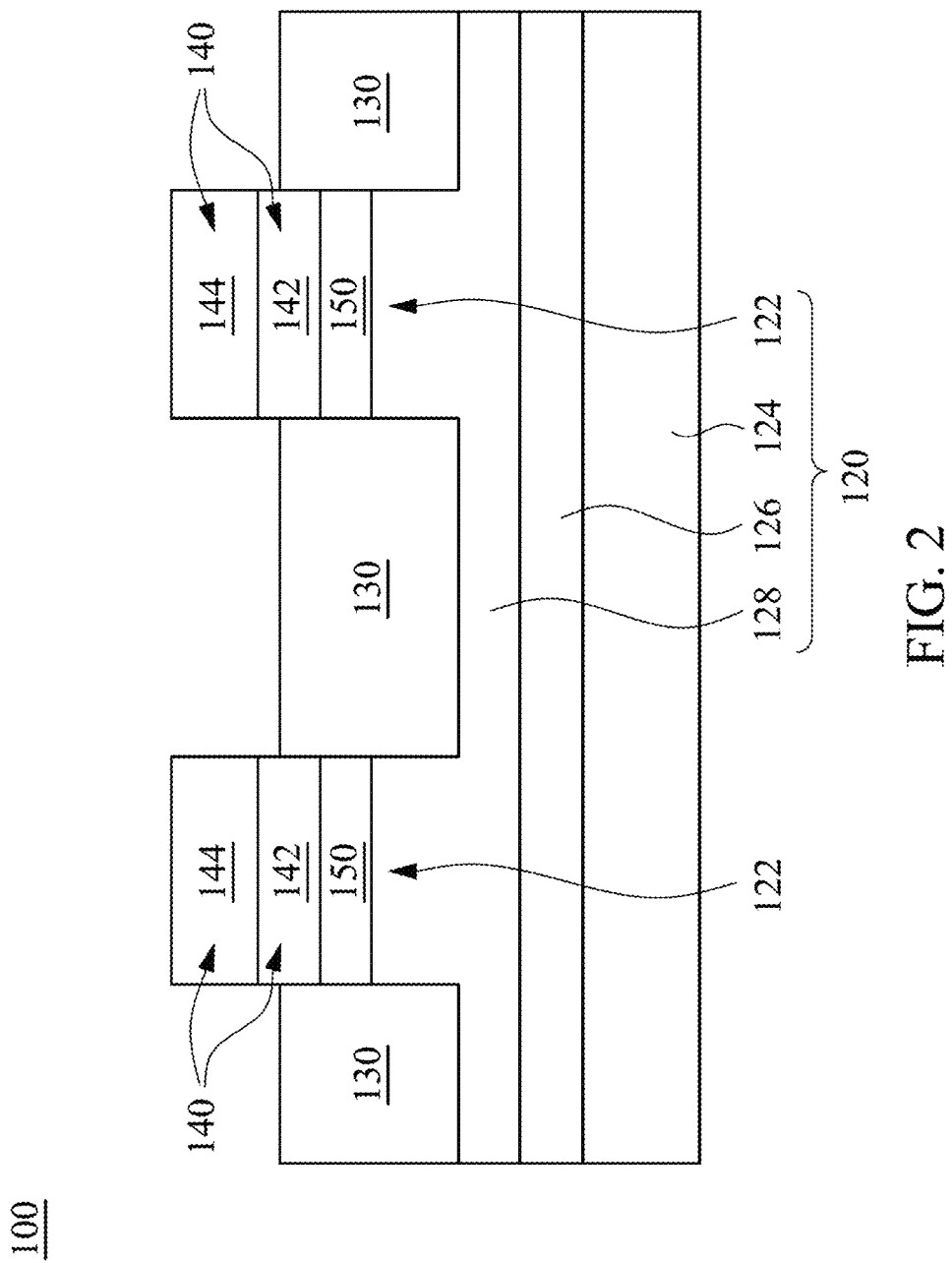
FIG. 2 illustrates a cross-sectional view of the direct type backlight device of FIG. 1 taken along line A-A' according to the first embodiment of the present invention.

FIG. 1 illustrates a top view of a direct type backlight device 100 according to a first embodiment of the present invention. FIG. 2 illustrates a cross-sectional view of the direct type backlight device 100 of FIG. 1 taken along line A-A' according to the first embodiment of the present invention. The direct type backlight device 100 includes a printed circuit board (PCB) 120, a light reflector 130 and plural Mini-LEDs 140.

In some embodiments of the present invention, the material used in fabricating the PCB 120 could be, for example, FR-4 (a composite material composed of woven glass cloth with an epoxy resin binder). In some embodiments of the present invention, the material used in fabricating the light reflector 130 could be, for example, Titanium dioxide ($TiO_2$).

Figure 3:
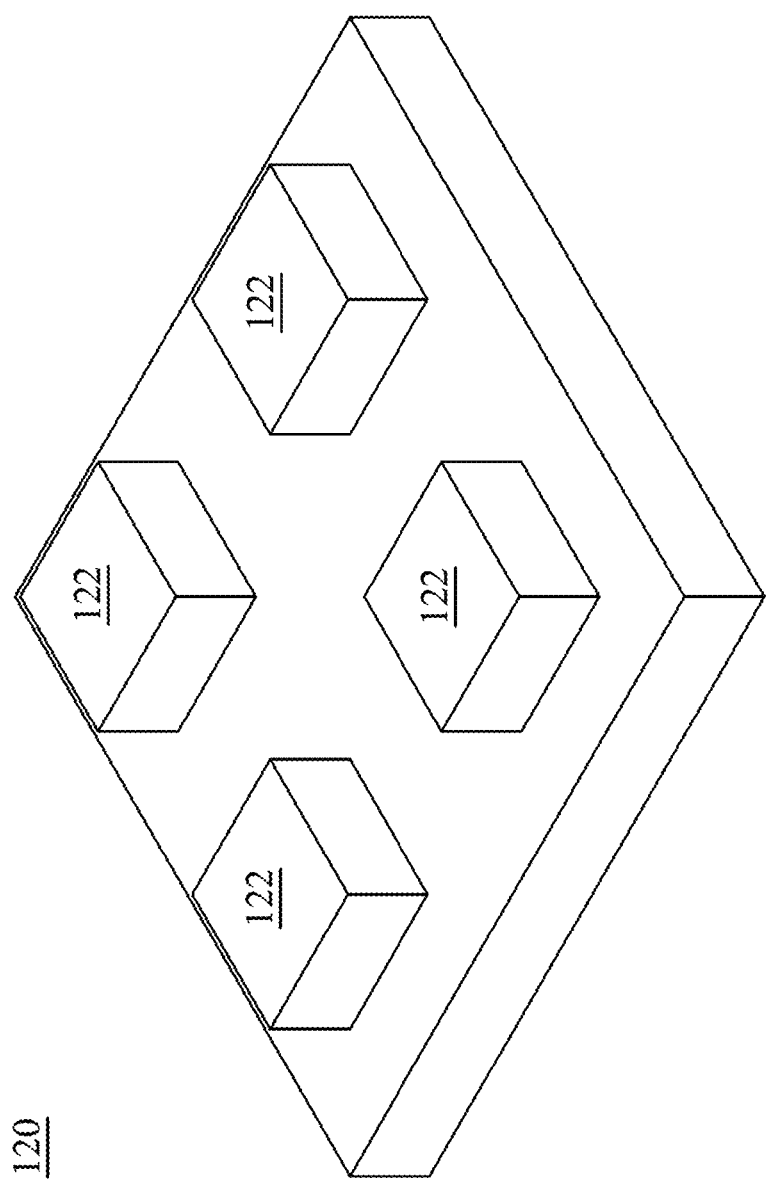
FIG. 3 illustrates a three dimensional view of a printed circuit board of the direct type backlight device according to the first embodiment of the present invention.

FIG. 3 illustrates a three dimensional view of the PCB 120 of the direct type backlight device 100 according to the first embodiment of the present invention. As shown in FIGS. 1-3, the PCB 120 has plural bump structures 122. The light reflector 130 is disposed over the PCB 120 but is not disposed over the bump structures 122. The Mini-LEDs 140 is disposed over the PCB 120 and is disposed over the bump structures 122. The light reflector 130 is arranged between at least part of adjacent Mini-LEDs 140. The light reflector 130 is arranged between at least part of adjacent bump structures 122. Specifically, the light reflector 130 surrounds the Mini-LEDs 140. It is noted that the number of the Mini-LEDs 140 or the number of the bump structures 122 as shown in FIGS. 1-3 is only an example and is not intended to limit the present invention.

Each of the Mini-LEDs 140 includes a non-light-emitting layer 142 and a light-emitting layer 144 arranged on the non-light-emitting layer 142. Specifically, the non-light-emitting layer 142 of the Mini-LED 140 is the substrate of the Mini-LED 140, and the light-emitting layer 144 of the Mini-LED 140 is the epitaxial layer of the Mini-LED 140.

As shown in FIG. 2, in some embodiments of the present invention, a bottom surface of the light-emitting layer 144 of the Mini-LED 140 is higher than a top surface of the light reflector 130. In other words, for the present invention, the top surface of the light reflector 130 would not be higher than the bottom surface of the light-emitting layer 144 of the Mini-LED 140. Therefore, the present invention could solve the problem of the known direct type backlight device, the said problem is that the higher that the top surface of the light reflector relative to the bottom surface of the Mini LEDs is, the worse the luminous efficiency is. Specifically, the direct type backlight device of the present invention designs a new structure of the PCB, that is, plural bump structures of the PCB are utilized to increase the height of the Mini-LEDs, thereby solving the problem that the increase of the thickness of the light reflector of the known direct type backlight device is limited.

It is noted that, in some embodiments of the present invention, the thicker the light reflector 130 is, the higher the relative reflectivity is. And, the higher the relative reflectivity is, the higher the brightness of the direct type backlight device is. And, the higher the brightness of the direct type backlight device is, the higher the luminous efficiency is. Therefore, for the present invention, when the bottom surface of the light-emitting layer 144 of the Mini-LED 140 is level with the top surface of the light reflector 130, the direct type backlight device 100 has the highest luminous efficiency. In other words, the preferred embodiment of the present invention is that the bottom surface of the light-emitting layer 144 of the Mini-LED 140 is level with the top surface of the light reflector 130.

Figure 4:
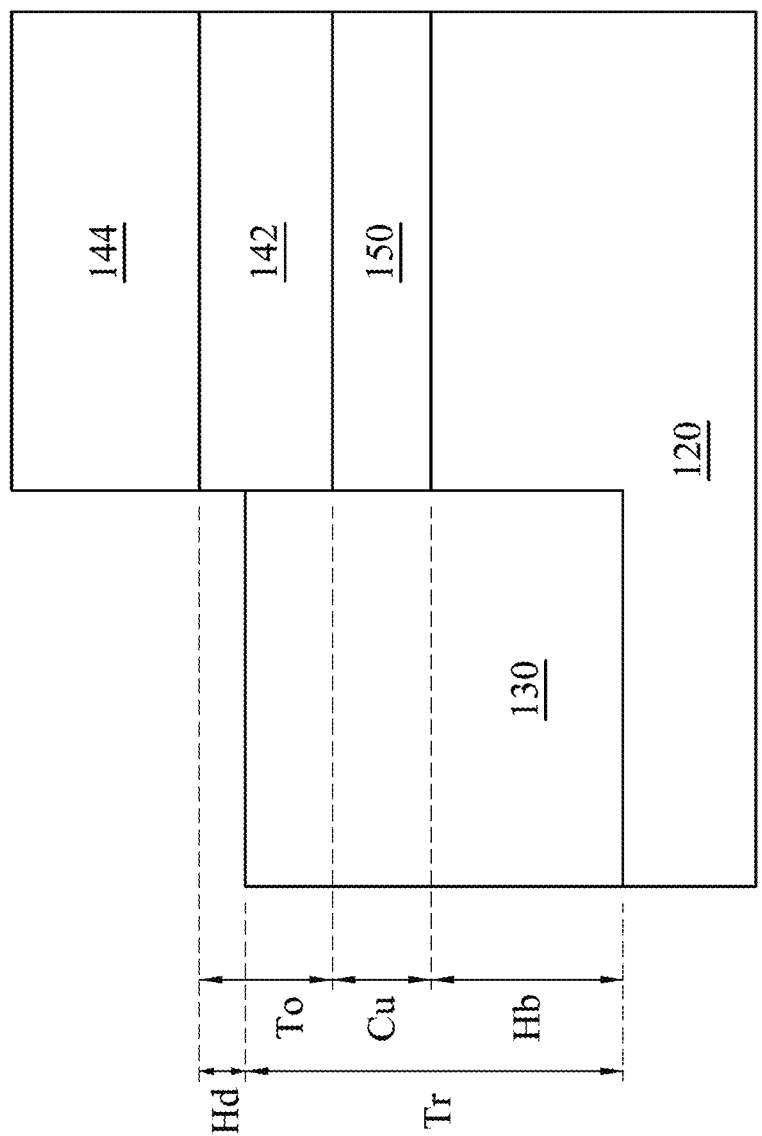
FIG. 4 illustrates a partial enlarged view of FIG. 2 according to the first embodiment of the present invention.

FIG. 4 illustrates a partial enlarged view of FIG. 2 according to the first embodiment of the present invention. The light reflector 130 has a thickness (Tr). The thickness (Tr) of the light reflector 130 has a tolerance (Ae). In some embodiments of the present invention, the tolerance (Ae) of the thickness (Tr) of the light reflector 130 could be, for example, 10%, but the present invention is not limited thereto. Specifically, the tolerance of the thickness of the light reflector is not fixed and is depending on manufacturing process and quality control capabilities of different suppliers. A distance from the bottom surface of the light-emitting layer 144 of the Mini-LED 140 to the top surface of the light reflector 130 is represented as (Hd). In some embodiments of the present invention, Hd≥(Tr*Ae).

Specifically, the design requirement of the present invention is that the bottom surface of the light-emitting layer 144 of the Mini-LED 140 is higher than the top surface of the light reflector 130, and therefore, ideally, the design requirement of the present invention is that the distance (Hd)≥0. However, during the actual manufacturing process, the thickness (Tr) of the light reflector 130 will inevitably have manufacturing tolerances. In order to ensure that the design requirement of the present invention could be met (i.e., the bottom surface of the light-emitting layer 144 of the Mini-LED 140 is higher than the top surface of the light reflector 130), in practice, the design requirement of the present invention is set as distance (Hd)≥(thickness (Tr)*tolerance (Ae)). And, the preferred embodiment of the present invention is that distance (Hd)=(thickness (Tr)*tolerance (Ae)).

As shown in FIG. 2, the PCB 120 further has plural bonding pads 150 disposed over the bump structures 122 of the PCB 120. And, the Mini-LEDs 140 are disposed over the bonding pads 150. In some embodiments of the present invention, the bonding pad 150 includes a metal layer (not shown) and a surface plating layer (not shown) disposed on the metal layer. The metal layer of the bonding pad 150 could be, for example, a copper metal layer. The surface plating layer of the bonding pad 150 is used as a protection layer to prevent the copper metal layer from being oxidized. The surface plating layer of the bonding pad 150 could be, for example, a layer plated with nickel and then plated with gold.

As shown in FIG. 4, the light reflector 130 has the thickness (Tr). The thickness (Tr) of the light reflector 130 has the tolerance (Ae). The distance from the bottom surface of the light-emitting layer 144 of the Mini-LED 140 to the top surface of the light reflector 130 is represented as (Hd). The bump structure 122 has the thickness (Hb). The bonding pad 150 has the thickness (Cu). The non-light-emitting layer 142 of the Mini-LED 140 has a thickness (To).

In some embodiments of the present invention, as shown in FIG. 4, Hb=Hd+Tr−Cu−To.

As discussed above, the design requirement of the present invention is set as Hd≥Tr*Ae. Therefore, the design requirement of the present invention is set as Hb≥(Tr*Ae)+Tr−Cu−To. In other words, the design requirement of the present invention is set as Hb≥Tr−Cu−(To−Tr*Ae).

As discussed above, the preferred embodiment of the present invention is that Hd=Tr*Ae. Therefore, the preferred embodiment of the present invention is that Hb=(Tr*Ae)+Tr−Cu−To. In other words, the preferred embodiment of the present invention is that Hb=Tr−Cu−(To−Tr*Ae).

As shown in FIG. 2, the PCB 120 includes a solder mask printing layer 124, a substrate layer 126, and a metal layer 128. The substrate layer 126 is disposed over the solder mask printing layer 124. The metal layer 128 is disposed over the substrate layer 126. In some embodiments of the present invention, the function of the solder mask printing layer 124 is moisture proof, solder mask, insulation, etc. The solder mask printing layer 124 may be an organic solderability preservative (OSP). The material used in fabricating the solder mask printing layer 124 could be, for example, phenolic epoxy oligomer, epoxy acrylate resin, or, etc.

Figure 5:
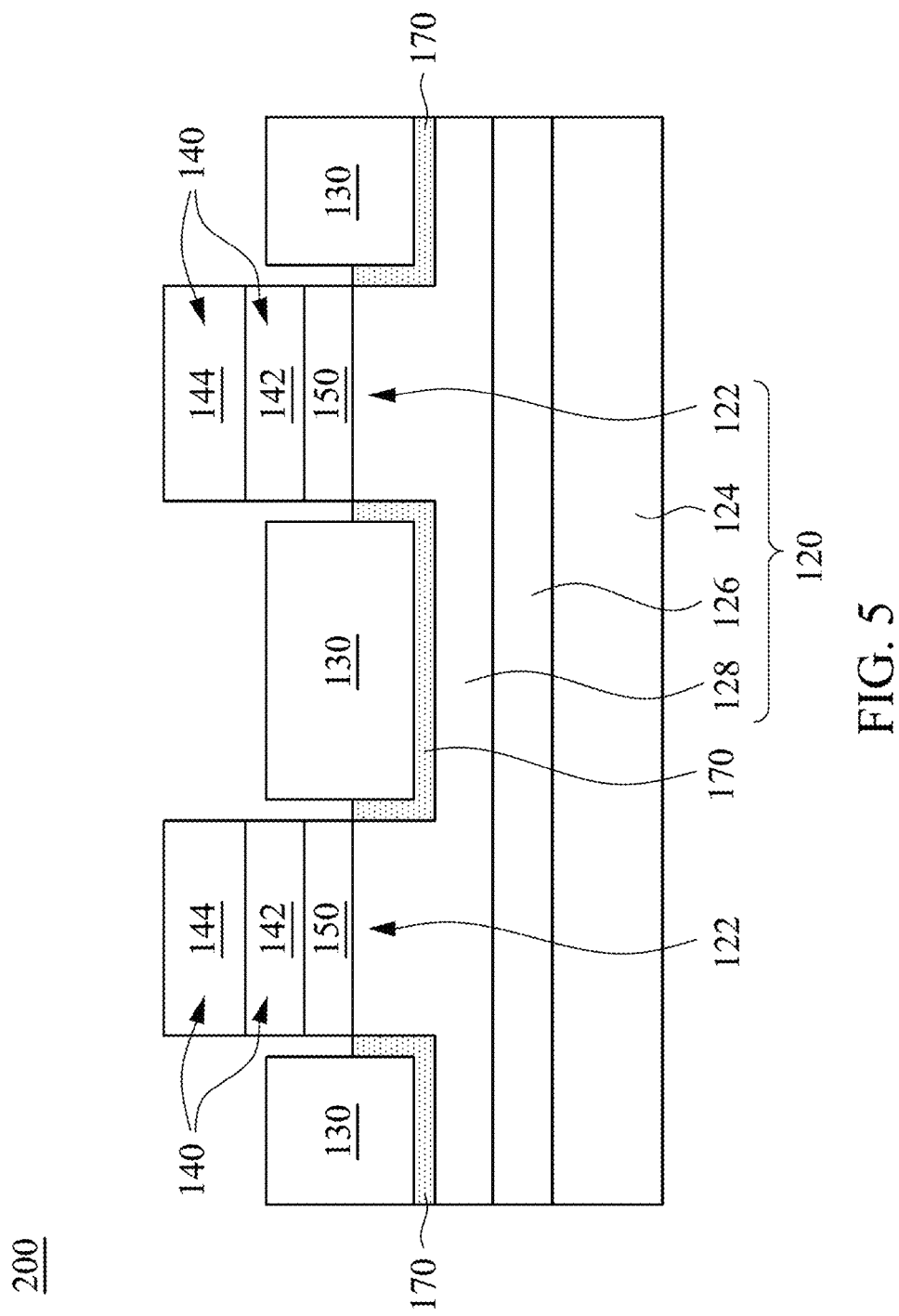
FIG. 5 illustrates a cross-sectional view of a direct type backlight device according to a second embodiment of the present invention.
Figure 6:
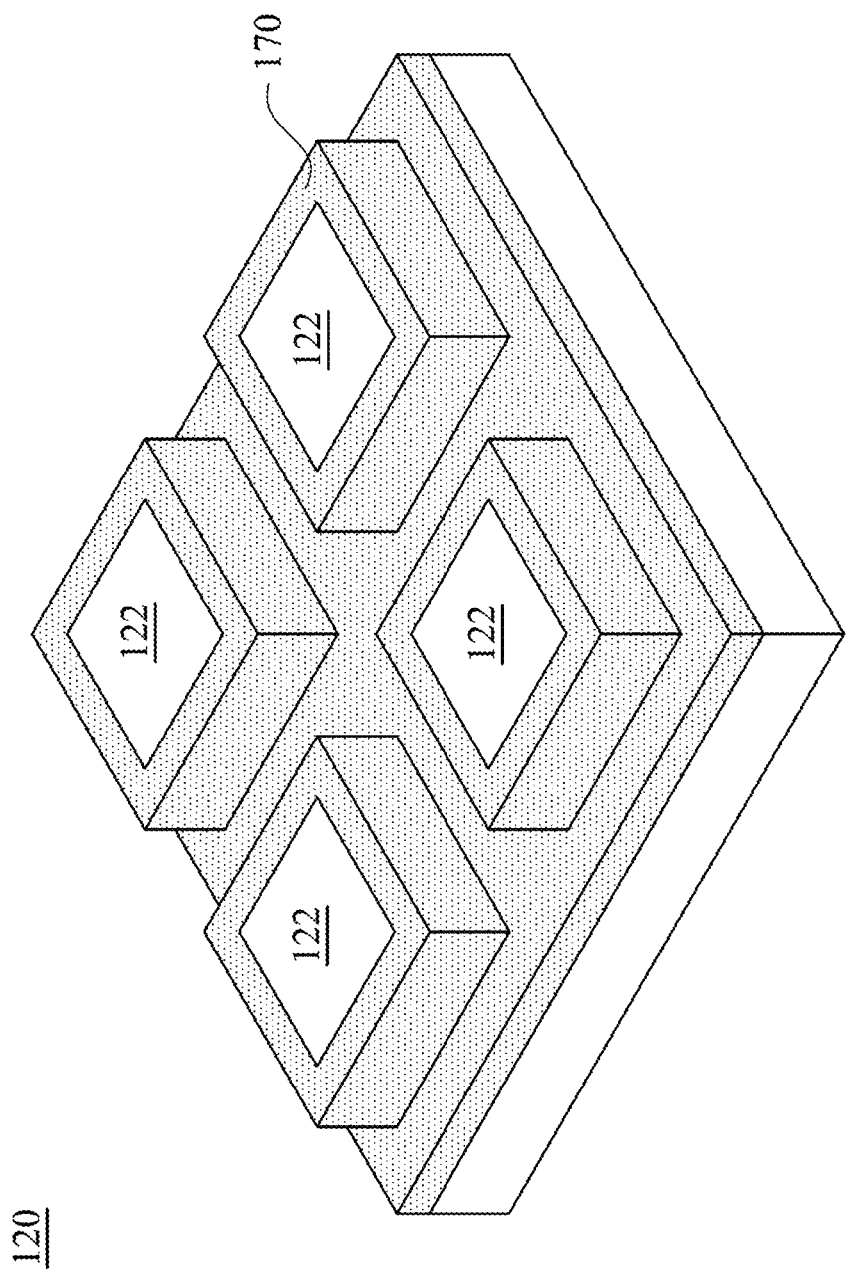
FIG. 6 illustrates a three dimensional view of a printed circuit board of the direct type backlight device according to the second embodiment of the present invention.

FIG. 5 illustrates a cross-sectional view of a direct type backlight device 200 according to a second embodiment of the present invention. FIG. 6 illustrates a three dimensional view of a PCB 120 of the direct type backlight device 200 according to the second embodiment of the present invention. The direct type backlight device 200 is similar to the direct type backlight device 100. The difference between the direct type backlight device 200 and the direct type backlight device 100 is that the direct type backlight device 200 further includes a solder mask layer 170. The solder mask layer 170 is conformally formed on an upper surface of the PCB 120 and a side surface of each of the bump structures 122. In the second embodiment of the present invention, the function of the solder mask layer 170 is moisture proof, solder mask, insulation, etc. The solder mask layer 170 may be an organic solderability preservative (OSP). The material used in fabricating the solder mask layer 170 could be, for example, phenolic epoxy oligomer, epoxy acrylate resin, or, etc.

Figure 7:
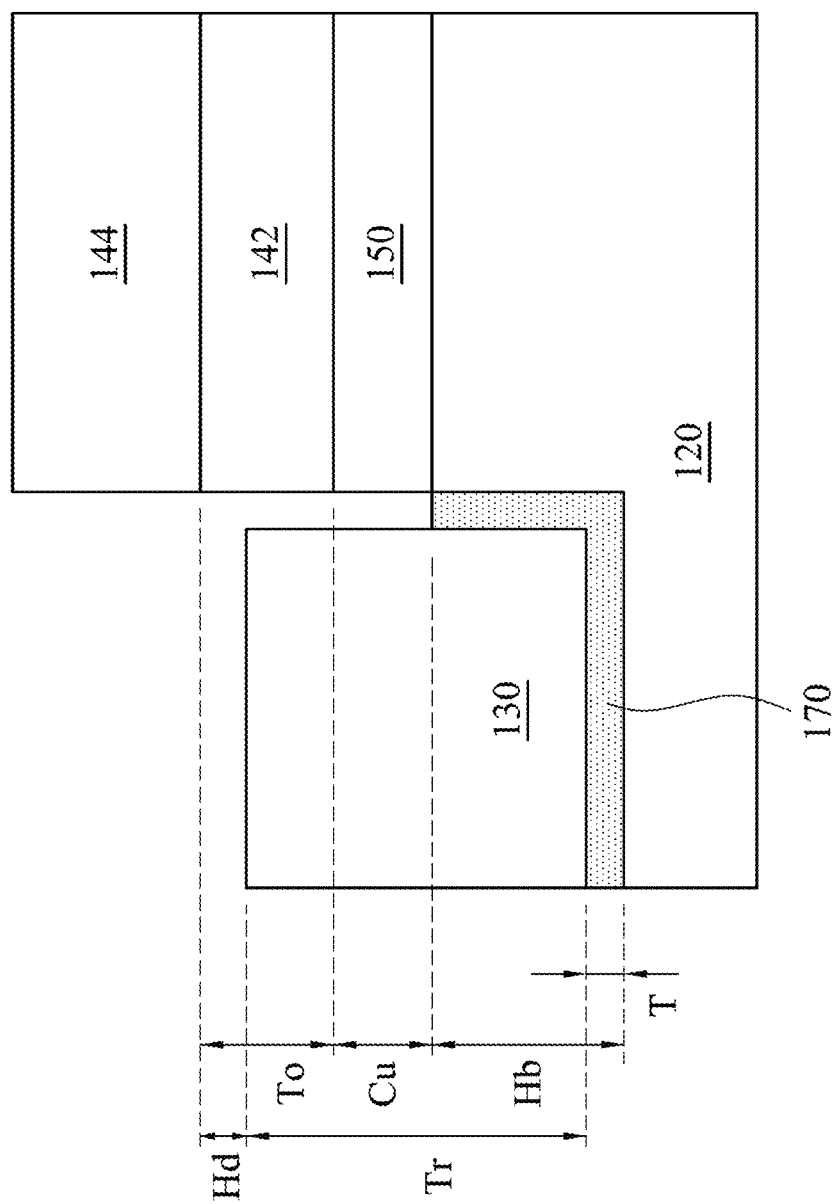
FIG. 7 illustrates a partial enlarged view of FIG. 5 according to the second embodiment of the present invention.

FIG. 7 illustrates a partial enlarged view of FIG. 5 according to the second embodiment of the present invention. The light reflector 130 has the thickness (Tr). The thickness (Tr) of the light reflector 130 has the tolerance (Ae). The distance from the bottom surface of the light-emitting layer 144 of the Mini-LED 140 to the top surface of the light reflector 130 is represented as (Hd). The bump structure 122 has the thickness (Hb). The bonding pad 150 has the thickness (Cu). The solder mask layer 170 has a thickness (T). The non-light-emitting layer 142 of the Mini-LED 140 has a thickness (To). In the second embodiment of the present invention, the direct type backlight device 200 includes the solder mask layer 170, as shown in FIG. 7, Hb=Hd+Tr−Cu−To+T.

As discussed above, the design requirement of the present invention is set as Hd≤Tr*Ae. Therefore, the design requirement of the direct type backlight device 200 including the solder mask layer 170 is set as Hb≥(Tr*Ae)+Tr−Cu−To+T. In other words, the design requirement of the direct type backlight device 200 including the solder mask layer 170 is set as Hb≥Tr−Cu−(To−Tr*Ae)+T.

As discussed above, the preferred embodiment of the present invention is that Hd=Tr*Ae. Therefore, the preferred embodiment of the direct type backlight device 200 including the solder mask layer 170 is that Hb=(Tr*Ae)+Tr−Cu−

To+T. In other words, the preferred embodiment of the direct type backlight device 200 including the solder mask layer 170 is that Hb=Tr−Cu−(To−Tr*Ae)+T.

It is noted that the aforementioned embodiments of the present invention use Mini-LEDs for illustration, however, the present invention is not limited thereto. The direct type backlight device of the present invention could also use LED or micro LED as the light source.

In some embodiments of the present invention, for the PCB 120, a photomask etching process is utilized such that the bump structures 122 are correspondingly formed on a vertical projection of the bonding pads 150, and then the bonding pads 150 are respectively disposed on the bump structures 122. In addition, in other embodiments of the present invention, plural sub-bumps could be also respectively formed on the bump structures 122, and then the bonding pads 150 are respectively disposed on the said sub-bumps.

In some embodiments of the present invention, each of the Mini-LEDs 140 is electrically connected to the PCB 120 through the flip chip technology. In other words, a solder bump is formed on the contact pad of the die of the Mini-LED 140, and then the Mini-LED 140 is flipped, and then the solder bump is melted by a reflow process. After the solder bump is cooled and solidified, the solder bump of the Mini-LED 140 could be electrically connected to the corresponding bonding pad 150, thereby realizing the electrical interconnection between the contact pad of the Mini-LED 140 and the bonding pad 150 of the PCB 120.

Figure 8:
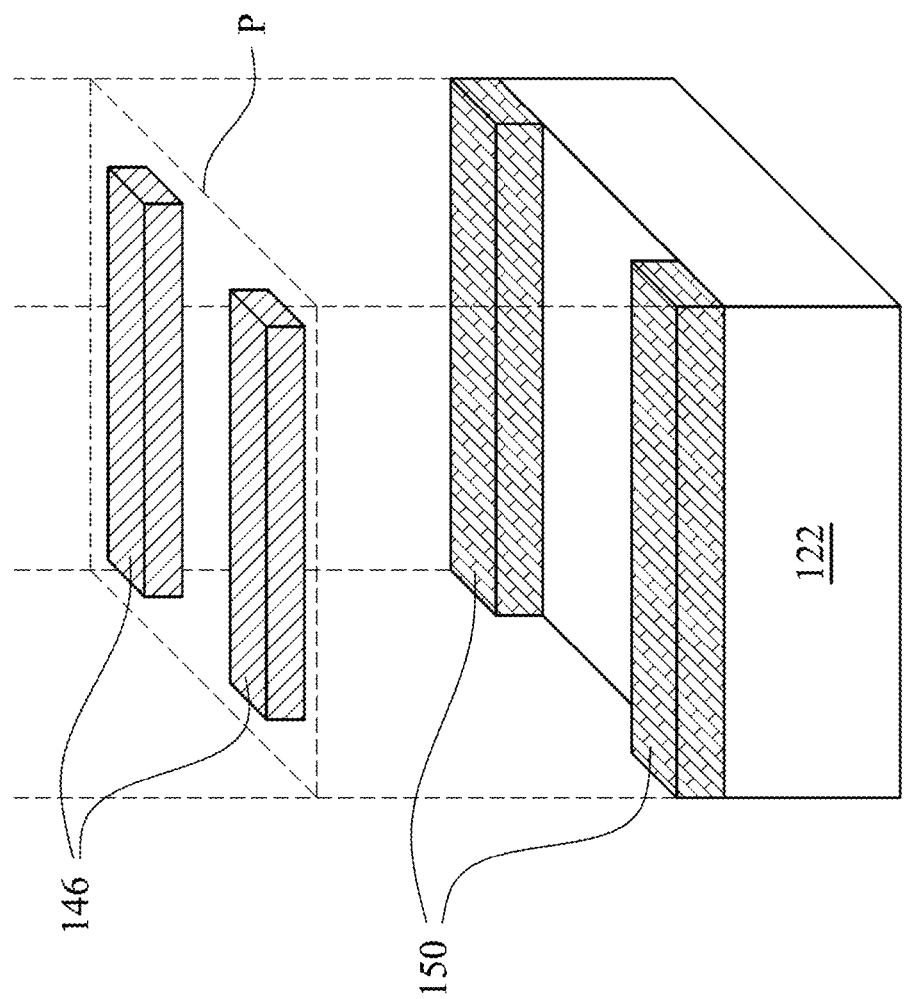
FIG. 8 illustrates a diagram showing the relative position in a vertical direction between a bonding pad over a bump structure and a contact pad of the Mini-LED according to the first embodiment of the present invention.

FIG. 8 illustrates a diagram showing the relative position in a vertical direction between the bonding pad 150 over the bump structure 122 and a contact pad 146 of the Mini-LED 140 according to the first embodiment of the present invention. In general, two bonding pads 140 with opposite polarities are disposed on each of the bump structures 122 of the PCB 120, such that the said two bonding pads 140 are respectively electrically connected to two contact pads 146 (i.e., a positive polarity contact pad and a negative polarity contact pad) of the corresponding Mini-LED 140. In addition, the present invention is also suitable for vertical Mini-LED, and then only one bonding pad is disposed on each of the bump structures of the PCB.

In some embodiments of the present invention, in order to ensure that the positive polarity contact pad and the negative polarity contact pad of the Mini-LED 140 could be better aligned to the corresponding two bonding pads (with opposite polarities) on the bump structure 122 which is below the Mini-LED 140, as shown in FIG. 8, the design requirement of the present invention is that the contact pads 146 of the Mini-LED 140 is required to be located within an upward vertical projection P of the bump structure 122. In other words, the contact pads 146 of the Mini-LED 140 are disposed within a vertical projection P of the corresponding bump structure 122.

As discussed above, the present invention utilizes the flip chip technology and the reflow process such that the contact pads 146 of the Mini-LED 140 are electrically connected to the corresponding bump structure 122 of the PCB 120. During the reflow process, due to the surface tension effect, the melted solder bump would be automatically bonded to the bonding pad 150 on the PCB 120 such that the contact pads 146 of the Mini-LED 140 and the corresponding bump structure 122 of the PCB 120 are self-aligned with each other. Such self-alignment capability could improve the misalignment due to the mounting skewing. In other words, the surface tension effect could help the two butting pads (i.e., the contact pad and the bonding pad) to be gradually align during the reflow process, thereby achieving self-alignment.

Figure 9:
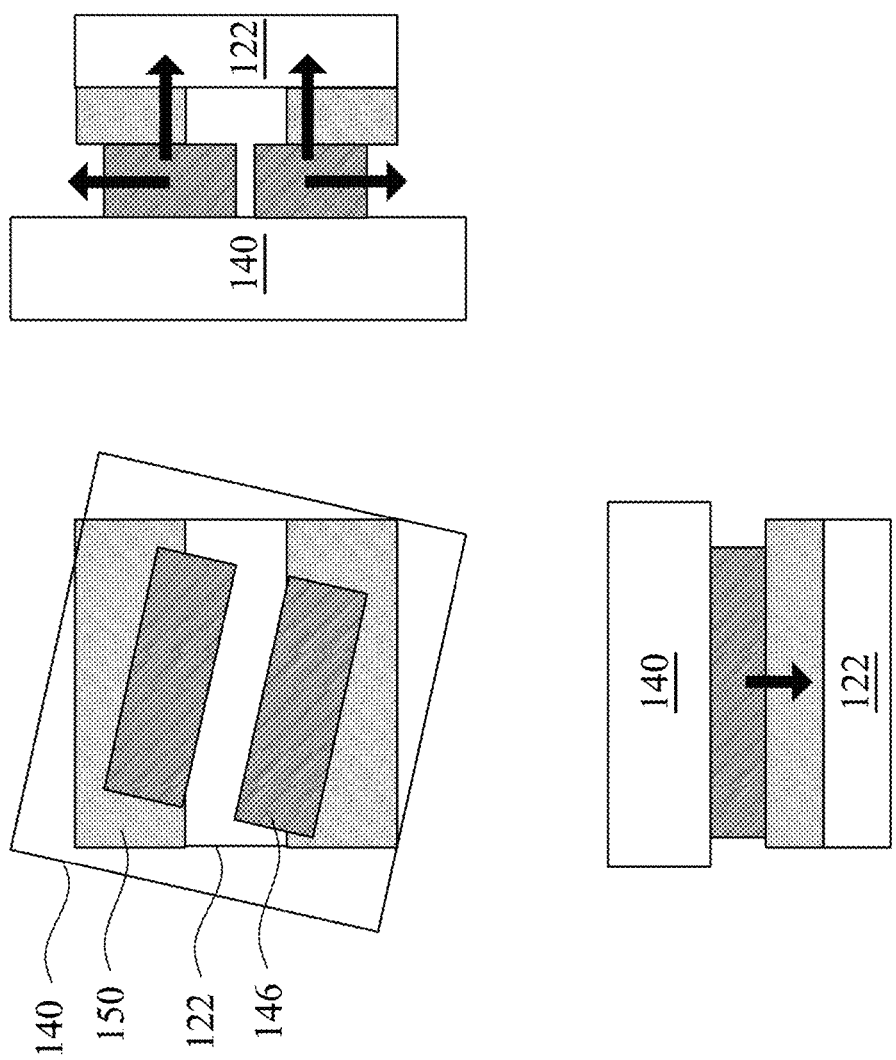
FIG. 9 illustrates a diagram showing the misalignment problem.

In general, each of the Mini-LEDs has two contact pads (i.e., the positive polarity contact pad and the negative polarity contact pad) to be correspondingly respectively electrically connected to two bonding pads on the PCB. However, when the mounting skewing is occurred, such kind of connection may still have the misalignment problem. FIG. 9 illustrates a diagram showing the misalignment problem. The upper left diagram of FIG. 9 is a top view of the Mini-LED 140 and the bump structure 122 of the PCB 120. It should be understood that, when the mounting skewing is occurred, some misalignment problems exist between two contact pads 146 of the Mini-LED 140 and two bonding pads 150 on the bump structure 122 of the PCB 120.

The upper right diagram of FIG. 9 is a right side view of the Mini-LED 140 and the bump structure 122 of the PCB 120. In other words, the upper right diagram of FIG. 9 shows the electrical connection of the butting pads in the vertical direction of the upper left diagram of FIG. 9. The thick black arrows in the upper right diagram of FIG. 9 represent the pulling direction of the surface tension effect. It could be seen that there are two directions of mutual traction of the surface tension effect existing in each group of the contact pad 146 and the bonding pad 150, and therefore the electrical connection of the butting pads in the vertical direction in the upper left diagram of FIG. 9 could be gradually aligned during the reflow process, thereby realizing self-alignment.

The bottom left diagram of FIG. 9 is a front side view of the Mini-LED 140 and the bump structure 122 of the PCB 120. In other words, the bottom left diagram of FIG. 9 shows the electrical connection of the butting pads in the horizontal direction of the upper left diagram of FIG. 9. As shown in the bottom left diagram of FIG. 9, only one direction of traction of the surface tension effect existing between the contact pad 146 and the bonding pad 150, and therefore the electrical connection of the butting pads in the horizontal direction in the upper left diagram of FIG. 9 could not be completely aligned during the reflow process. As shown in the bottom left diagram of FIG. 9, the left side gap between the contact pad 146 and the bonding pad 150 is smaller than the right side gap between the contact pad 146 and the bonding pad 150.

Figure 10:
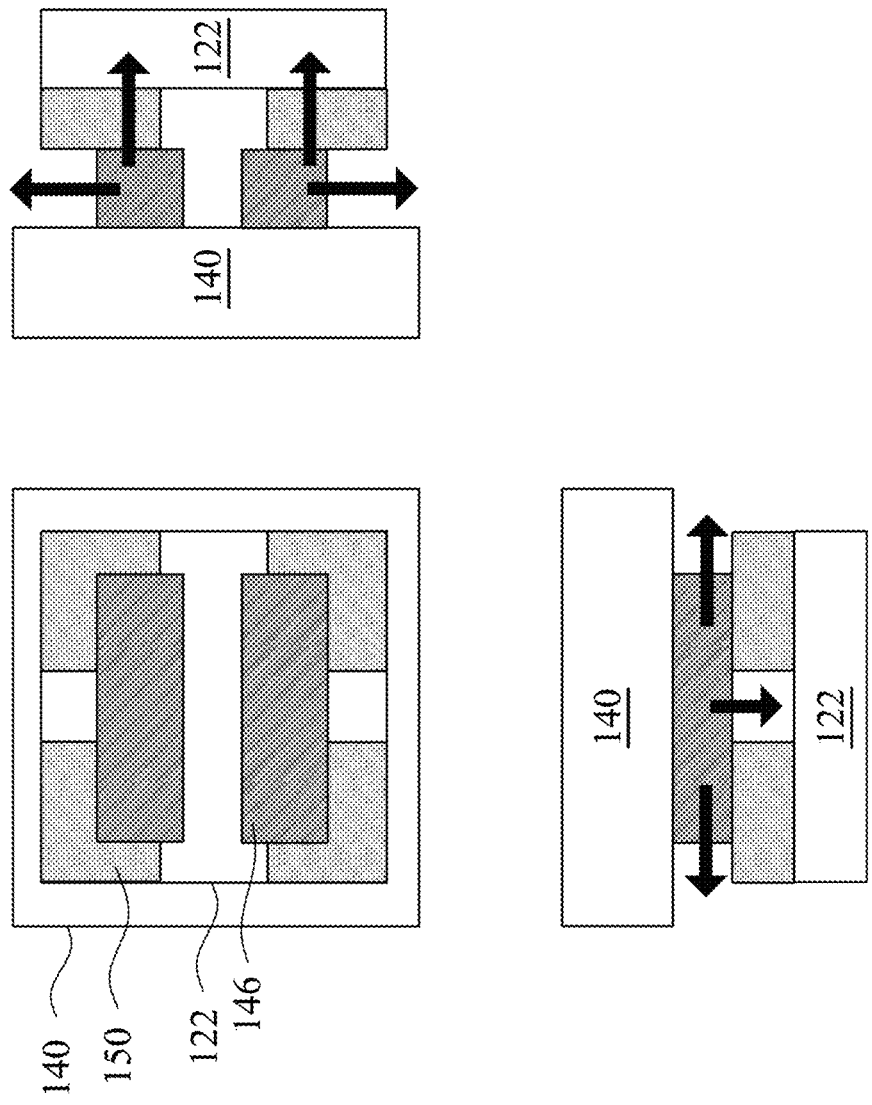
FIG. 10 illustrates a diagram showing the design change of the bonding pad according to a third embodiment of the present invention.

FIG. 10 illustrates a diagram showing the design change of the bonding pad 150 according to a third embodiment of the present invention. The design change as shown in FIG. 10 could improve the self-alignment capability between the contact pads 146 and the bonding pads 150 during the reflow process, such that, when the mounting skewing is occurred, the misalignment problem could be improved. As shown in FIG. 10, each of the Mini-LEDs 140 has two contact pads 146 (i.e., one positive polarity contact pad and one negative polarity contact pad), and each of the contact pads 146 of the Mini-LED 140 would be electrically connected to two bonding pads 150 on the PCB 120. In other words, each of the contact pads 146 is electrically connected to two bonding pads 150 in a one-by-two manner.

The upper left diagram of FIG. 10 is a top view of the Mini-LED 140 and the bump structure 122 of the PCB 120. The upper right diagram of FIG. 10 is a right side view of the Mini-LED 140 and the bump structure 122 of the PCB 120. In other words, the upper right diagram of FIG. 10 shows the electrical connection of the butting pads in the vertical direction of the upper left diagram of FIG. 10. As shown in the upper right diagram of FIG. 10, there are two directions of mutual traction of the surface tension effect existing in each group of the contact pad 146 and the bonding pad 150, and therefore the electrical connection of the butting pads in the vertical direction in the upper left diagram of FIG. 10 could be gradually aligned during the reflow process, thereby realizing self-alignment.

The bottom left diagram of FIG. 10 is a front side view of the Mini-LED 140 and the bump structure 122 of the PCB 120. In other words, the bottom left diagram of FIG. 10 shows the electrical connection of the butting pads in the horizontal direction of the upper left diagram of FIG. 10. As shown in the bottom left diagram of FIG. 10, there are two direction of traction of the surface tension effect existing between the contact pad 146 and each of the corresponding two bonding pad 150, and therefore the electrical connection of the butting pads in the horizontal direction in the upper left diagram of FIG. 10 could be gradually aligned during the reflow process, thereby realizing self-alignment.

Figure 11:
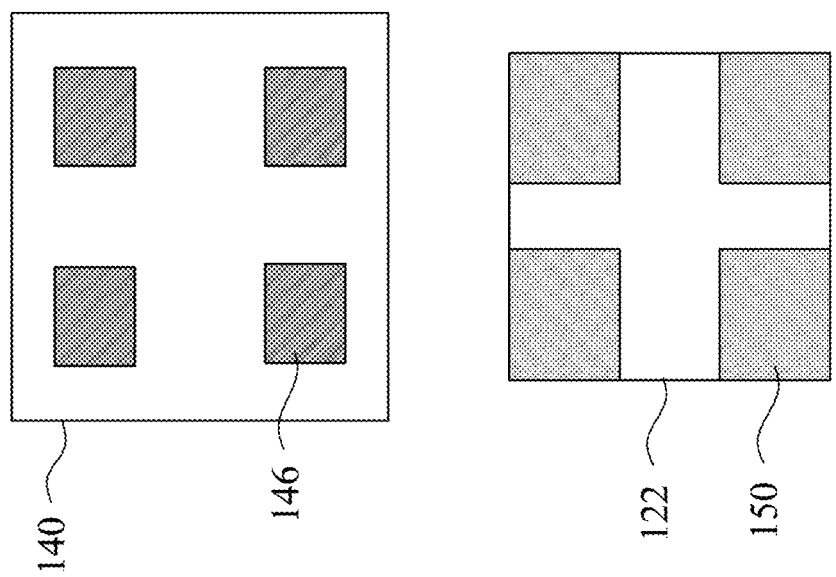
FIG. 11 illustrates a diagram showing the design change of the bonding pad and the contact pad according to a fourth embodiment of the present invention.

FIG. 11 illustrates a diagram showing the design change of the bonding pad 150 and the contact pad 146 according to a fourth embodiment of the present invention. The design change as shown in FIG. 11 could improve the self-alignment capability between the contact pads 146 and the bonding pads 150 during the reflow process, such that, when the mounting skewing is occurred, the misalignment problem could be improved. As shown in the upper left diagram of FIG. 11, each of the Mini-LEDs 140 has four contact pads 146 (i.e., two positive polarity contact pads and two negative polarity contact pads). As shown in the bottom left diagram of FIG. 11, there are four bonding pads 150 on the bump structure 122 corresponding to each of the Mini-LEDs 140. In other embodiments of the present invention, four sub-bump structures are correspondingly formed on the PCB in the vertical projection of the said four bonding pads.

As shown in the right diagram of the FIG. 11, the said four contact pads 146 of each of the Mini-LEDs 140 would be respectively electrically connected to the four bonding pads 150 on the PCB 120. In other words, the contact pads 146 of the Mini-LED 140 are electrically connected to the corresponding bonding pads 150 in a one-by-one manner.

Since each of the contact pads 146 is electrically connected to one corresponding bonding pad 150, there are two directions of mutual traction of the surface tension effect existing between one of the contact pads 146 and the corresponding one bonding pad 150 electrically connected to the one of the contact pads. Therefore, the electrical connection of the butting pads in FIG. 11 could be gradually aligned during the reflow process, thereby realizing self-alignment.

From the above description, the present invention provides a direct type backlight device which designs new structure of the PCB. Plural bump structures of the PCB are utilized to increase the height of the Mini-LED, thereby solving the problem that the thickness of the light reflector of the known direct type backlight device is limited and effectively improving the luminous efficiency of the direct type backlight device.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A direct type backlight device, comprising:
a printed circuit board (PCB);
a light reflector disposed over the PCB; and
a plurality of Mini-LEDs disposed over the PCB;
wherein the light reflector is arranged between at least part of adjacent Mini-LEDs;
wherein each of the Mini-LEDs includes a non-light-emitting layer and a light-emitting layer arranged on the non-light-emitting layer;
wherein a bottom surface of the light-emitting layer of each of the Mini-LEDs is higher than a top surface of the light reflector;
wherein the light reflector has a thickness (Tr), wherein the thickness (Tr) of the light reflector has a tolerance (Ae);
wherein the PCB has a plurality of bump structures and a plurality of bonding pads disposed over the bump structures, wherein the Mini-LEDs are respectively disposed over the bump structures and the Mini-LEDs are disposed over the bonding pads;
wherein each of the bump structures has a thickness (Hb), wherein each of the bonding pads has a thickness (Cu), wherein the non-light-emitting layer of each of the Mini-LEDs has a thickness (To), wherein Hb=Tr−Cu−(To−Tr*Ae).

2. The direct type backlight device of claim 1, wherein a distance from the bottom surface of the light-emitting layer of each of the Mini-LEDs to the top surface of the light reflector is represented as (Hd), wherein Hd≥(Tr*Ae).

3. The direct type backlight device of claim 1, wherein at least two contact pads of one of the Mini-LEDs are disposed within a vertical projection of one of the bump structures, wherein the one of the bump structures corresponds to the one of the Mini-LEDs.

4. The direct type backlight device of claim 1, wherein the PCB further has a solder mask layer conformally formed on an upper surface of the PCB and a side surface of each of the bump structures.

5. The direct type backlight device of claim 4, wherein the light reflector is disposed over the solder mask layer, wherein the solder mask layer partially covers the light reflector.

6. The direct type backlight device of claim 1, wherein each of the bonding pads comprises a metal layer and a surface plating layer disposed on the metal layer.

7. The direct type backlight device of claim 1, wherein the PCB comprises:
a solder mask printing layer;
a substrate layer disposed over the solder mask printing layer; and
a metal layer disposed over the substrate layer.

8. The direct type backlight device of claim 1, wherein each of the Mini-LEDs has two contact pads, wherein the contact pads are electrically connected to the bonding pads in a one-by-two manner.

9. The direct type backlight device of claim 1, wherein each of the Mini-LEDs has four contact pads, wherein the contact pads are electrically connected to the bonding pads in a one-by-one manner.

10. A direct type backlight device, comprising:
a printed circuit board (PCB) has a plurality of bump structures;

a light reflector arranged between at least part of adjacent bump structures; and a plurality of Mini-LEDs respectively disposed over the bump structures;

wherein each of the Mini-LEDs includes a non-light-emitting layer and a light-emitting layer arranged on the non-light-emitting layer;

wherein a bottom surface of the light-emitting layer of each of the Mini-LEDs is higher than a top surface of the light reflector;

wherein the light reflector has a thickness (Tr), wherein the thickness (Tr) of the light reflector has a tolerance (Ae);

wherein the PCB further has a plurality of bonding pads disposed over the bump structures, wherein the Mini-LEDs are disposed over the bonding pads;

wherein each of the bump structures has a thickness (Hb), wherein each of the bonding pads has a thickness (Cu), wherein the non-light-emitting layer of each of the Mini-LEDs has a thickness (To), wherein Hb=Tr−Cu−(To−Tr*Ae).

11. The direct type backlight device of claim 10, wherein a distance from the bottom surface of the light-emitting layer of each of the Mini-LEDs to the top surface of the light reflector is represented as (Hd), wherein Hd≥(Tr*Ae).

12. The direct type backlight device of claim 10, wherein at least two contact pads of one of the Mini-LEDs are disposed within a vertical projection of one of the bump structures, wherein the one of the bump structures corresponds to the one of the Mini-LEDs.

13. The direct type backlight device of claim 10, wherein the PCB further has a solder mask layer conformally formed on an upper surface of the PCB and a side surface of each of the bump structures, wherein the light reflector is disposed over the solder mask layer, wherein the solder mask layer partially covers the light reflector.

14. A direct type backlight device, comprising:

a printed circuit board (PCB);

a light reflector disposed over the PCB; and a plurality of Mini-LEDs disposed over the PCB;

wherein the light reflector is arranged between at least part of adjacent Mini-LEDs;

wherein each of the Mini-LEDs includes a non-light-emitting layer and a light-emitting layer arranged on the non-light-emitting layer;

wherein a bottom surface of the light-emitting layer of each of the Mini-LEDs is higher than a top surface of the light reflector;

wherein the light reflector has a thickness (Tr), wherein the thickness (Tr) of the light reflector has a tolerance (Ae);

wherein the PCB has a plurality of bump structures and a plurality of bonding pads disposed over the bump structures, wherein the Mini-LEDs are respectively disposed over the bump structures and the Mini-LEDs are disposed over the bonding pads;

wherein the PCB further has a solder mask layer conformally formed on an upper surface of the PCB and a side surface of each of the bump structures;

wherein each of the bump structures has a thickness (Hb), wherein each of the bonding pads has a thickness (Cu), wherein the non-light-emitting layer of each of the Mini-LEDs has a thickness (To), wherein the solder mask layer has a thickness (T), wherein Hb=Tr−Cu−(To−Tr*Ae)+T.

* * * * *